(12) United States Patent
Hallivuori

(10) Patent No.: US 7,508,244 B2
(45) Date of Patent: Mar. 24, 2009

(54) TUNING OF A PHASE-LOCKED LOOP, AND AN ELECTRONIC DEVICE

(75) Inventor: Juha Hallivuori, Tampere (FI)

(73) Assignee: Nokia Corporation, Espoo (FI)

( * ) Notice: Subject to any disclaimer, the term of this patent is extended or adjusted under 35 U.S.C. 154(b) by 40 days.

(21) Appl. No.: 11/477,765

(22) Filed: Jun. 30, 2006

(65) Prior Publication Data

US 2007/0279110 A1 Dec. 6, 2007

(30) Foreign Application Priority Data

May 31, 2006 (FI) .............................. 200653365

(51) Int. Cl.
*H03L 7/06* (2006.01)
(52) U.S. Cl. .......................... 327/156; 331/16
(58) Field of Classification Search .................. None
See application file for complete search history.

(56) References Cited

U.S. PATENT DOCUMENTS 7,015,738 B1 * 3/2006 Cao ............................ 327/159
7,148,760 B2 * 12/2006 Vaananen .................... 331/25
2005/0057289 A1 * 3/2005 Pham ........................ 327/156

FOREIGN PATENT DOCUMENTS

EP 1 220 454 A2 7/2002

OTHER PUBLICATIONS

Santos, Dinis M., "A CMOS Delay Locked Loop and Sub-Nanosecond Time-To-Digital Converter Chip", IEEE transactions on Nuclear Science, vol. 43, No. 3, Jun. 1996.

* cited by examiner

*Primary Examiner*—Cassandra Cox
(74) *Attorney, Agent, or Firm*—Squire, Sanders & Dempsey, L.L.P.

(57) ABSTRACT

There is provided an electronic device comprising: a control block for providing a control signal; a voltage-controlled oscillator; a divider block; a detector block for receiving a frequency-divided output signal from the divider block, for receiving a reference frequency signal and for providing a feedback control signal to the voltage-controlled oscillator. The voltage-controlled oscillator is further configured to include a frequency offset to the voltage-controlled oscillator output signal; and the control block is further configured to control the frequency offset included in the voltage-controlled oscillator output signal on the basis of fractional division ratio information and actual division state information received from the phase-locked loop.

7 Claims, 3 Drawing Sheets

TUNING OF A PHASE-LOCKED LOOP, AND AN ELECTRONIC DEVICE

FIELD

The invention relates to a tuning method of a phase-locked loop, and to an electronic device.

BACKGROUND

A phase-locked loop (PLL) is an electronic circuit that controls a voltage-controlled oscillator (VCO) frequency for maintaining a constant phase angle/frequency relative to a reference signal. In telecommunications, the oscillator is usually a part of the receiver and/or transmitter. A digital PLL circuit may consist of a serial shift register which receives a digital control which is extracted using the received signal, a stable local clock signal which supplies clock pulses to the shift register to drive it and a phase comparator circuit which uses the local clock and a PLL-induced signal to match the VCO frequency to a received signal. A basic PLL can comprise a reference oscillator, a phase/frequency detector, a loop filter, a VCO and a divider.

FIG. 1 shows an example of a block diagram of a phase-locked loop (PLL) with a voltage-controlled oscillator 200 that provides an output signal 220, according to the prior art. A control block 202 provides digital tuning to the circuit. The output lines 204, 206, 208 of the control block 202 control the digital frequency tuning circuit of the VCO 200. Typically the PLL comprises also a divider block 210 that divides the frequency of the output signal by a predetermined number N (integer or fractional), thus providing a divided output frequency signal 211. A phase detector 214 utilizes a reference frequency signal 212 and a filtering block (e.g. a low pass filter, LPF) 216 in a feedback loop to the VCO 200. The phase detector 214, which includes a charge pump, is used to generate a dc voltage to control VCO 200 output frequency. The dc voltage is proportional to the frequency difference of an output frequency signal 211 and the reference frequency signal 212. Any higher frequency signal in the phase detector 214 output is filtered with a filter 216 to reduce noise in the VCO 200. An example of a conventional tuning method of a voltage-controlled oscillator is described in a patent publication EP 1 220 454.

PLLs are widely used as frequency synthesizers in many applications where it is necessary to generate signals with precise frequency, with low spurs and good phase noise. VCO's frequency in PLL operation may be changed by varying the reference frequency or the divisor. An integer PLL is a well-known circuit with simplicity and robustness. However, the channel spacing in an integer PLL is limited to the multiples of a reference clock. This causes problems in PLL settling time design or, in contrast, causes limited sized channel spacing.

The foregoing problem is usually solved with a fractional division ratio PLL. However, the fractionality brings other problems to the design, for example spurs. One solution to lower the spurs has been a Sigma-Delta modulation type of noise re-shaping. However, PLL circuits with Sigma-Delta modulation are very complicated and space consuming. Further, the known methods concentrate on correcting the flaw effects in a fractional PLL operation rather than removing the flaws themselves.

BRIEF DESCRIPTION OF THE INVENTION

An object of the invention is to provide an improved electronic device with a phase-locked loop, and an improved tuning method of a phase-locked loop in an electronic device.

According to an aspect of the invention, there is provided an electronic device with a phase-locked loop, comprising: a control block for providing a control signal; a voltage-controlled oscillator for receiving the control signal and for outputting an output signal; a divider block for receiving the output signal from the voltage-controlled oscillator and for dividing the frequency of the output signal by a predetermined number; a detector block for receiving a frequency-divided output signal from the divider block, for receiving a reference frequency signal and for providing a feedback control signal to the voltage-controlled oscillator in the phase-locked loop. The voltage-controlled oscillator is further configured to include a frequency offset in the voltage-controlled oscillator output signal; and the control block is further configured to control the frequency offset included in the voltage-controlled oscillator output signal on the basis of fractional division ratio information and actual division state information received from the phase-locked loop.

According to another aspect of the invention, there is provided a tuning method of a phase-locked loop in an electronic device, the method comprising: providing, by a control block, a control signal; receiving, by a voltage-controlled oscillator, the control signal and outputting an output signal; receiving, by a divider block, the output signal from the voltage-controlled oscillator and dividing the frequency of the output signal by a predetermined number; receiving, by a detector block, a frequency-divided output signal from the divider block, receiving a reference frequency signal and providing a feedback control signal to the voltage-controlled oscillator in the phase-locked loop. The method further comprising: including a frequency offset to the voltage-controlled oscillator output signal by the voltage-controlled oscillator; and controlling, by the control block, the frequency offset included in the voltage-controlled oscillator output signal on the basis of fractional division ratio information and actual division state information received from the phase-locked loop.

The invention provides several advantages. The power consumption is reduced. The size of an electronic device (e.g. receiver/transmitter) can be reduced. More accurate tuning of the phase-locked loop is enabled. Cost saving and robustness in low-power system solutions are provided.

LIST OF DRAWINGS

In the following, the invention will be described in greater detail with reference to the embodiments and the accompanying drawings, in which FIG. 1 shows a block diagram of a phase-locked loop according to the prior art;

DESCRIPTION OF EMBODIMENTS

Figure 1:
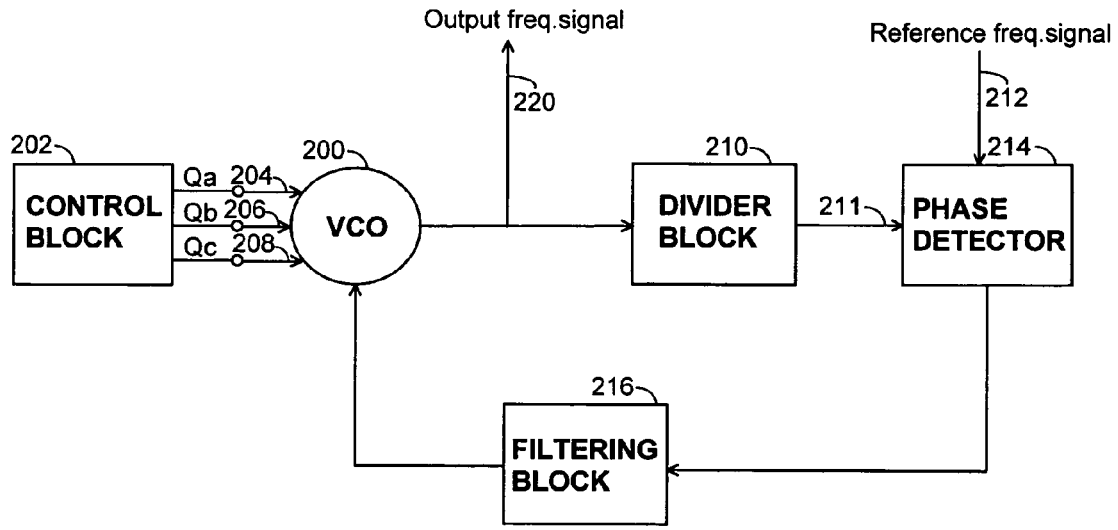
Figure 2:
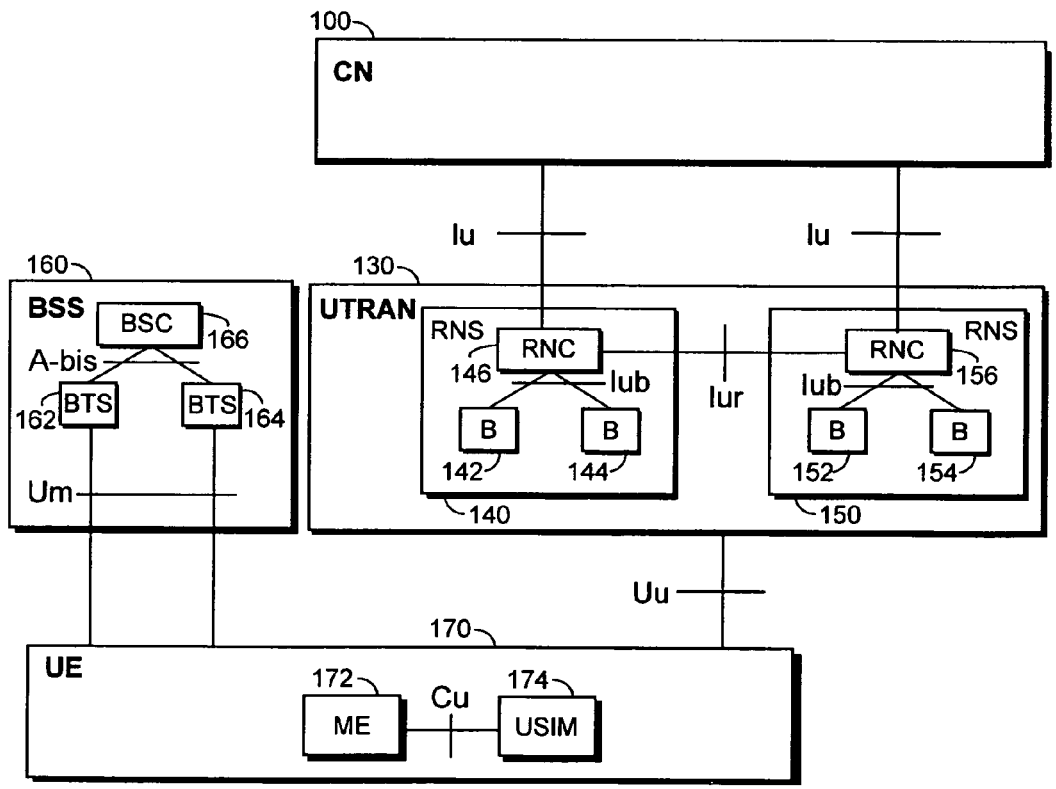
FIG. 2 illustrates a radio system to which embodiments of the invention can be applied.

With reference to FIG. 2, examine an example of a radio system in which the different embodiments of the invention can be applied. A radio system in FIG. 2, known at least as UMTS (Universal Mobile Telecommunications System) and IMT-2000 (International Mobile Telecommunications 2000), represents the third-generation radio systems. The embodiments are, however, not restricted to these systems described by way of example, but a person skilled in the art can also apply the instructions to other radio systems containing corresponding characteristics. The electronic device can be, for example, user equipment, a portable communication device, a mobile computer, a mobile phone, or basically any device with a receiver/transmitter in the radio system.

FIG. 2 is a simplified block diagram, which shows the most important parts of a radio system and the interfaces between them at network-element level. The structure and functions of the network elements are not described in detail, because they are generally known.

The main parts of a radio system are a core network (CN) 100, a radio access network 130 and user equipment (UE) 170. The term UTRAN is short for UMTS Terrestrial Radio Access Network, i.e. the radio access network 130 belongs to the third generation and is implemented by wideband code division multiple access (WCDMA) technology. FIG. 2 also shows a base station system 160 which belongs to the 2/2.5 generation and is implemented by time division multiple access (TDMA) technology, but it is not further described here.

On a general level, the radio system can also be defined to comprise user equipment, which is also known as a subscriber terminal and mobile phone, for instance, and a network part, which comprises the fixed infrastructure of the radio system, i.e. the core network, radio access network and base station system.

The structure of the core network 100 corresponds to a combined structure of the GSM and GPRS systems. The GSM network elements are responsible for establishing circuit-switched connections, and the GPRS network elements are responsible for establishing packet-switched connections; some of the network elements are, however, in both systems.

The base station system 160 comprises a base station controller (BSC) 166 and base transceiver stations (BTS) 162, 164. The base station controller 166 controls the base transceiver station 162, 164. In principle, the aim is that the devices implementing the radio path and their functions reside in the base transceiver station 162, 164, and control devices reside in the base station controller 166.

The base station controller 166 takes care of the following tasks, for instance: radio resource management of the base transceiver station 162, 164, intercell handovers, frequency control, i.e. frequency allocation to the base transceiver stations 162, 1604, management of frequency hopping sequences, time delay measurement on the uplink, implementation of the operation and maintenance interface, and power control.

The base transceiver station 162, 164 contains at least one transceiver, which provides one carrier, i.e. eight time slots, i.e. eight physical channels. Typically, one base transceiver station 162, 164 serves one cell, but it is also possible to have a solution in which one base transceiver station 162, 164 serves several sectored cells. The diameter of a cell can vary from a few meters to tens of kilometers. The base transceiver station 162, 164 also comprises a transcoder, which converts the speech-coding format used in the radio system to that used in the public switched telephone network and vice versa. In practice, the transcoder is, however, physically located in the mobile services switching center. The tasks of the base transceiver station 162, 164 include: calculation of timing advance (TA), uplink measurements, channel coding, encryption, decryption, and frequency hopping.

The radio access network 130 is made up of radio network subsystems 140, 150. Each radio network subsystem 140, 150 is made up of radio network controllers 146, 156 and B nodes 142, 144, 152, 154. A B node is a rather abstract concept, and often the term base transceiver station is used instead.

Operationally, the radio network controller 140, 150 corresponds approximately to the base station controller 166 of the GSM system, and the B node 142, 144, 152, 154 corresponds approximately to the base transceiver station 162, 164 of the GSM system. Solutions also exist in which the same device is both the base transceiver station and the B node, i.e. said device is capable of implementing both the TDMA and the WCDMA radio interface simultaneously.

The user equipment 170 may comprise mobile equipment (ME) 172 and a UMTS subscriber identity module (USIM) 174. USIM 174 contains information related to the user and information related to information security in particular, for instance, an encryption algorithm.

In UMTS networks, the user equipment 170 can be simultaneously connected with a plurality of base transceiver stations (Node B) in occurrence of soft handover.

In UMTS, the most important interfaces between network elements are the Iu interface between the core network and the radio access network, which is divided into the interface IuCS on the circuit-switched side and the interface IuPS on the packet-switched side, and the Uu interface between the radio access network and the user equipment. In GSM, the most important interfaces are the A interface between the base station controller and the mobile services switching center, the Gb interface between the base station controller and the serving GPRS support node, and the Um interface between the base transceiver station and the user equipment. The interface defines what kind of messages different network elements can use in communicating with each other. The aim is to provide a radio system in which the network elements of different manufacturers interwork well so as to provide an effective radio system. In practice, some of the interfaces are, however, vendor-dependent.

Figure 3:
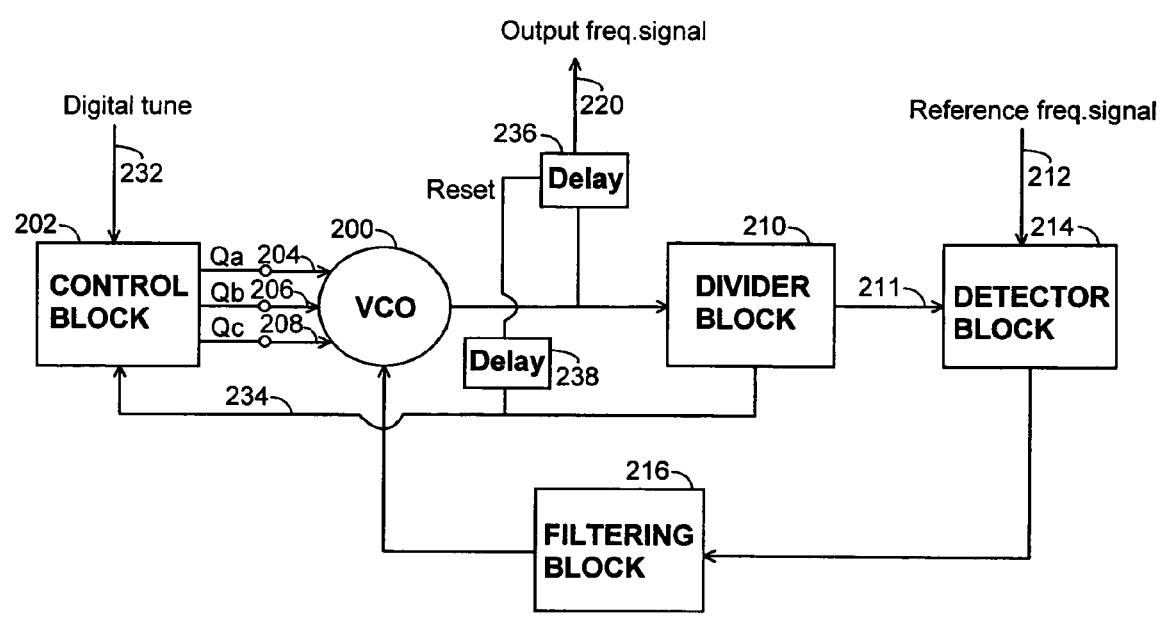
FIG. 3 illustrates a block diagram of an electronic device with a virtually fractional phase-locked loop according to an embodiment of the pre-sent invention.

FIG. 3 illustrates a part of an exemplary block diagram of an electronic device, e.g. an adaptive receiver, with a virtually fractional phase-locked loop according to an embodiment of the present invention. The electronic device comprises a control block 202 for digital frequency tuning, typically implemented with a microprocessor, a signal processor or separate components and associated software. The control block 202 receives a control signal 232 for performing digital pre-calibration tuning of the VCO. An example of a known electronic device with a PLL is described in US patent publication U.S. Pat. No. 7,015,763. Depending on the type of device, there may also be a different number of user interface parts. The present invention can also be applied to more conventional type of VCOs where some other means than digital tuning to change the VCO frequency is used. However, the PLL according to embodiments of the invention requires means to offset the VCO frequency by some means.

The output lines 204, 206, 208 of the control block 202 control the digital frequency tuning of the VCO 200 and thus the frequency of the phase-locked loop. The control block 202 sends a control signal 204, 206, 208 to the voltage-controlled oscillator 200. In this example, the used control signal is a digital frequency control signal, however, the control signal type can be analog or digital. The voltage-controlled oscillator 200 provides a frequency output signal 220. A divider block 210 receives the output signal from the voltage-controlled oscillator 200 and divides the frequency of the output signal by a predetermined number, thus providing a divided output frequency signal 211. A phase/frequency detector block 214 compares a reference frequency signal 212 with the divided VCO frequency signal 211 and provides a phase error signal to a filtering block (e.g. a low pass filter, LPF) 216 from which a pure dc level is inputted in the voltage-controlled oscillator 200. (The detector block 214 provides a feedback control signal that is proportional to the frequency difference of an output frequency signal 211 and the reference frequency signal 212 to the voltage-controlled oscillator 200 after filtering by the filtering block 216.)

According to an embodiment, the voltage-controlled oscillator 200 is further configured to include a frequency offset to the output signal, and the control block 202 is further configured to control the frequency offset included in the output signal on the basis of fractional division ratio information, and actual division state information 234 received from the phase-locked loop for providing tuning of the phase-locked loop. The fractional division ratio information can be preset by the control block 202, and the actual division state information 234 is received by the control block 202 from the divider block 210.

The fractional division spurs in the electronic device are, thus, corrected by providing a correct fractionally divided frequency instead of a mean value of two different frequency divisions as in prior art fractional division rate phase-locked loops. The correct fractional divided frequency is constructed by introducing a small offset frequency at the voltage-controlled oscillator 200 in a small part of the time, which is visible to the divider block 210 prior to the phase detector 214. The operation is seen as a fractional division in the phase detector end and it provides, thus, a smaller tuning to the VCO oscillation frequency than a multiple of a reference clock would allow.

On-chip design of voltage-controlled oscillators nowadays usually includes switchable capacitors as part of the process variation compensation. In the embodiments of the invention, the capacitor matrix can be reused such that the integer type of the phase-locked loop can be operated in a virtually fractional division mode. With this kind of structure it is possible to achieve almost any fractional division ratio.

The divider block 210 of FIG. 3 provides division-stage information to the control block 202, which, in turn, controls the capacitance matrix of the voltage-controlled oscillator 200. This information is a simple bit, which can be zero when the division/counter is between 0 to N-M and one at M counted edges. M is preferably a small integer, such as 1. When one is at digital control input, the digital control block 202 provides the predefined frequency shift control to the voltage-controlled oscillator 200. The M, frequency shift and the state change time define the overall fractional division ratio. When the divided offsetted frequency is introduced in the phase detector 214, the operation of the phase-locked loop changes the actual voltage-controlled oscillator operation frequency by the amount of the effective offset frequency. If the condition inside the phase-locked loop is not changed, the phase-locked loop will lock.

In an embodiment, the electronic device may further comprise a series of resettable delay components 236, 238. The idea of using delay components is described, e.g., in the reference: Dinis M. Santos, Scott F. Dow, Jeremy M. Flasck, Michael E. Levi; IEEE Transactions on nuclear science, Vol. 43, No. 3, June 1996: 'A CMOS Delay Locked Loop and Sub-Nanosecond Time-to-Digital Converter Chip'. After the accuracy of the phase is defined, a required amount of resettable delay components 236, 238 can be added between the voltage-controlled oscillator 200 and the divider block 210. By controlling the frequency cycles, incorrect frequencies can be removed from the voltage-controlled oscillator 200 by resetting the delay component 236, 238 with the wrong frequency and connecting the right frequencies together with the correct phase by tuning the individual delay. The only error may be the jitter introduced by the delay components 236, 238, however, this is far less than the phase noise of the VCO 200 and causes no problems if the delay line is properly designed. The main difference in this embodiment compared with the Santos reference mentioned above, is the fact that here the phase-locked loop remains untouched and only the frequency out of the phase-locked loop, i.e. signal 220, is modified. The delay line can be clocked by the same information that is used to add the frequency shift inside the phase-locked loop. Thus, the time of appearance of the incorrect frequency can be known.

In an embodiment, the resettable delay components 236, 238 can also be replaced by using a divider having some oscillating tendencies. In some embodiments, the frequency offset can be tolerated by the system and no extra circuits for the offset frequency cancellation are needed.

Figure 4:
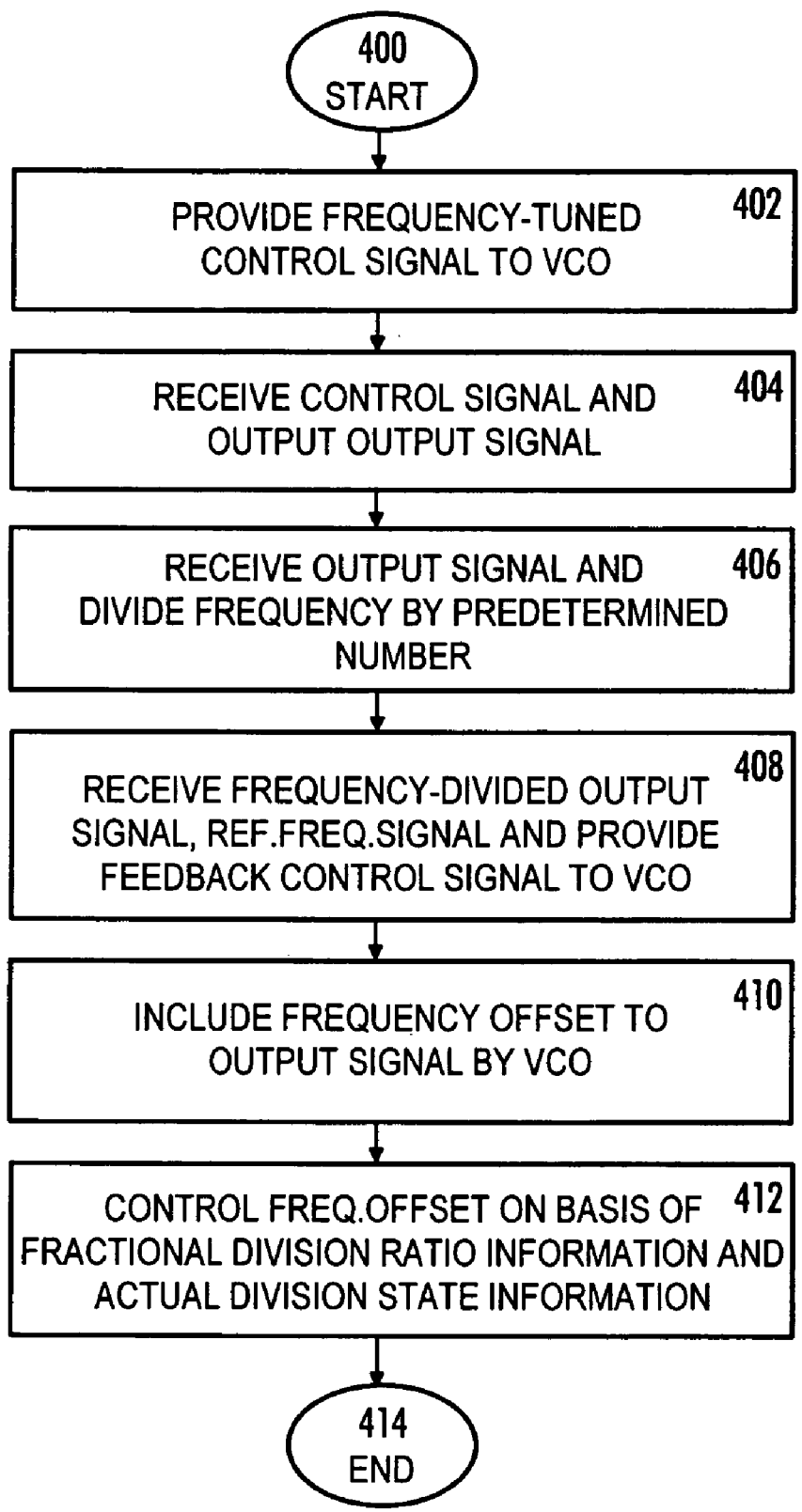
FIG. 4 illustrates an example of a digital tuning method according to an embodiment of the present invention.

FIG. 4 illustrates an example of a digital tuning method according to an embodiment of the present invention.

The method starts in 400.

In 402, a digital frequency tuned control signal is provided by a control block. In 404, the digital frequency tuned control signal is received, by a voltage-controlled oscillator, and an output signal is outputted.

In 406, the output signal is received, by a divider block, from the voltage-controlled oscillator and the frequency of the output signal is divided by a predetermined number.

In 408, a frequency-divided output signal is received, by a phase detector, from the divider block, a reference frequency signal is received and a feedback control signal is provided to the voltage-controlled oscillator.

In 410, the frequency offset is included in the output signal by the voltage-controlled oscillator.

In 412, the control block controls the frequency offset included in the output signal on the basis of fractional division ratio information and actual division state information received from the phase-locked loop.

The method ends in 414.

Even though the invention has been described above with reference to an example according to the accompanying drawings, it is clear that the invention is not restricted thereto but it can be modified in several ways within the scope of the appended claims.

The invention claimed is:

1. An apparatus comprising:
a control block configured to provide a control signal;
a voltage-controlled oscillator configured to receive the control signal and to output an output signal;
a divider block configured to receive the output signal from the voltage-controlled oscillator and configured to divide a frequency of the output signal by a predetermined number;
a detector block configured to
receive a frequency-divided output signal from the divider block,
receive a reference frequency signal, and
provide a feedback control signal to the voltage-controlled oscillator in a phase-locked loop, wherein the voltage-controlled oscillator is further configured to include a frequency offset in the voltage-controlled oscillator output signal, wherein the control block is further configured to control the frequency offset included in the voltage-controlled oscillator output signal based on fractional division ratio information and actual division state information received from the phase-locked loop, and the phase-locked loop further comprising one or more resettable delay components configured to remove incorrect frequencies from the voltage-controlled oscillator output signal.

2. The apparatus of claim 1, wherein the control block is further configured to remove a detected incorrect frequency from the voltage-controlled oscillator output signal by resetting the delay components with the incorrect frequency and by connecting a correct frequency with a correct phase by tuning an individual delay.

3. An apparatus comprising:
a control block configured to provide a control signal;
a voltage-controlled oscillator configured to receive the control signal and to output an output signal;
a divider block configured to receive the output signal from the voltage-controlled oscillator and configured to divide a frequency of the output signal by a predetermined number;
a detector block configured to
receive a frequency-divided output signal from the divider block,
receive a reference frequency signal, and
provide a feedback control signal to the voltage-controlled oscillator in a phase-locked loop,
wherein the voltage-controlled oscillator is further configured to include a frequency offset in the voltage-controlled oscillator output signal,
wherein the control block is further configured to control the frequency offset included in the voltage-controlled oscillator output signal based on fractional division ratio information and actual division state information received from the phase-locked loop, and
wherein the divider block is configured to provide an extra digital control to the output signal, the extra digital control being a simple bit.

4. An apparatus comprising:
a control block configured to provide a control signal;
a voltage-controlled oscillator configured to receive the control signal and to output an output signal;
a divider block configured to receive the output signal from the voltage-controlled oscillator and configured to divide a frequency of the output signal by a predetermined number;
a detector block configured to
receive a frequency-divided output signal from the divider block,
receive a reference frequency signal, and
provide a feedback control signal to the voltage-controlled oscillator in a phase-locked loop,
wherein the voltage-controlled oscillator is further configured to include a frequency offset in the voltage-controlled oscillator output signal, wherein the control block is further configured to control the frequency offset included in the voltage-controlled oscillator output signal based on fractional division ratio information and actual division state information received from the phase-locked loop, and wherein the overall fractional division ratio provided by the phase-locked loop is based on an amount of calculated signal edges in the divider block, the received frequency control signal and a state change time.

5. A method comprising:
providing, by a control block, a control signal;
receiving, by a voltage-controlled oscillator, the control signal and outputting an output signal;
receiving, by a divider block, the output signal from the voltage-controlled oscillator and dividing a frequency of the output signal by a predetermined number;
receiving, by a detector block, a frequency-divided output signal from the divider block, receiving a reference frequency signal and providing a feedback control signal to the voltage-controlled oscillator in a phase-locked loop;
including a frequency offset to the voltage-controlled oscillator output signal by the voltage-controlled oscillator;
controlling, by the control block, the frequency offset included in the voltage-controlled oscillator output signal based on fractional division ratio information and actual division state information received from the phase-locked loop; and
removing incorrect frequencies from the voltage-controlled oscillator output signal by one or more resettable delay components of the phase-locked loop.

6. The method of claim 5, further comprising removing a detected incorrect frequency from the voltage-controlled oscillator output signal by resetting the delay components with the incorrect frequency and by connecting a correct frequency with a correct phase by tuning an individual delay.

7. A method comprising:
providing, by a control block, a control signal;
receiving, by a voltage-controlled oscillator, the control signal and outputting an output signal;
receiving, by a divider block, the output signal from the voltage-controlled oscillator and dividing a frequency of the output signal by a predetermined number;
receiving, by a detector block, a frequency-divided output signal from the divider block, receiving a reference frequency signal and providing a feedback control signal to the voltage-controlled oscillator in a phase-locked loop;
including a frequency offset to the voltage-controlled oscillator output signal by the voltage-controlled oscillator; and
controlling, by the control block, the frequency offset included in the voltage-controlled oscillator output signal based on fractional division ratio information and actual division state information received from the phase-locked loop,
wherein the overall fractional division ratio provided by the phase-locked loop is based on an amount of calculated signal edges in the divider block, the received frequency control signal and a state change time.

* * * * *